(12) United States Patent
Hattori et al.

(10) Patent No.: US 12,125,708 B2
(45) Date of Patent: Oct. 22, 2024

(54) ETCHING METHOD

(71) Applicant: Hitachi High-Tech Corporation, Tokyo (JP)

(72) Inventors: Takashi Hattori, Tokyo (JP); Yu Zhao, Tokyo (JP); Hiroyuki Kobayashi, Tokyo (JP); Hiroto Otake, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 5 days.

(21) Appl. No.: 17/276,982

(22) PCT Filed: Apr. 10, 2020

(86) PCT No.: PCT/JP2020/016071
§ 371 (c)(1),
(2) Date: Mar. 17, 2021

(87) PCT Pub. No.: WO2021/205632
PCT Pub. Date: Oct. 14, 2021

(65) Prior Publication Data
US 2022/0115239 A1    Apr. 14, 2022

(51) Int. Cl.
*H01L 21/311*   (2006.01)
*H01L 21/02*   (2006.01)
(Continued)

(52) U.S. Cl.
CPC .. *H01L 21/31116* (2013.01); *H01L 21/02164* (2013.01); *H01L 21/3065* (2013.01); *H01L 21/67115* (2013.01)

(58) Field of Classification Search
None
See application file for complete search history.

(56) References Cited

U.S. PATENT DOCUMENTS 5,022,961 A    6/1991   Izumi et al.
5,571,375 A    11/1996  Izumi et al.
(Continued)

FOREIGN PATENT DOCUMENTS

CN   109075075 A   12/2018
JP   H07153737 A   6/1995
(Continued)

OTHER PUBLICATIONS

Office Action mailed Dec. 7, 2021 in Japanese Application No. 2021-510470.
(Continued)

*Primary Examiner* — Roberts P Culbert
(74) *Attorney, Agent, or Firm* — Miles & Stockbridge, P.C.

(57) ABSTRACT

Provided is an etching method for etching a silicon oxide film with a high accuracy at a high selection ratio with respect to a silicon nitride film, the etching method of etching a film structure, in which an end portion of a film layer in which the silicon oxide film and the silicon nitride film formed in advance on a wafer disposed in a processing chamber are alternately stacked in a vertical direction forms a side wall of a groove or a hole, by supplying processing gas into the processing chamber includes a step of supplying hydrogen fluoride and alcohol vapor into the processing chamber, maintaining the wafer at a temperature of −20° C. or lower, preferably −20° C. to −60° C., and etching the silicon oxide film from the end portion in a lateral direction.

9 Claims, 10 Drawing Sheets

(51) Int. Cl.
  *H01L 21/3065* (2006.01)
  *H01L 21/67* (2006.01)

(56) References Cited

U.S. PATENT DOCUMENTS

| | | | |
|---|---|---|---|
| 9,613,823 B2 | 4/2017 | Demichi et al. | |
| 10,319,603 B2 | 6/2019 | Chen et al. | |
| 2005/0275104 A1 | 12/2005 | Stamper | |
| 2006/0211163 A1* | 9/2006 | Ouellet | B81C 1/00936 |
| | | | 257/E21.252 |
| 2014/0206198 A1 | 7/2014 | Tahara et al. | |
| 2016/0020115 A1 | 1/2016 | Demichi et al. | |
| 2016/0196984 A1 | 7/2016 | Lill et al. | |
| 2018/0204728 A1 | 7/2018 | Domori et al. | |
| 2019/0013207 A1 | 1/2019 | Kobayashi et al. | |
| 2019/0027373 A1 | 1/2019 | Kwon et al. | |
| 2019/0027374 A1* | 1/2019 | Sim | H01L 21/0217 |
| 2019/0378724 A1 | 12/2019 | Toda et al. | |
| 2020/0098586 A1 | 3/2020 | Xia et al. | |
| 2020/0111674 A1 | 4/2020 | Sasahara et al. | |
| 2021/0375634 A1 | 12/2021 | Suzuki et al. | |

FOREIGN PATENT DOCUMENTS

| | | | |
|---|---|---|---|
| JP | H07169738 A | 7/1995 | |
| JP | 2004127990 A | 4/2004 | |
| JP | 2004296467 A | 10/2004 | |
| JP | 2005161493 A | 6/2005 | |
| JP | 2008502140 A | 1/2008 | |
| JP | 2013074220 A | 4/2013 | |
| JP | 2013219301 A | 10/2013 | |
| JP | 2016025195 A | 2/2016 | |
| JP | 2016129227 A | 7/2016 | |
| JP | 2017050529 A | 3/2017 | |
| JP | 2018207088 A | 12/2018 | |
| JP | 2019016698 A | 1/2019 | |
| JP | 2019212872 A | 12/2019 | |
| TW | 201920749 A | 6/2019 | |
| WO | WO-2020054476 A1 * | 3/2020 | C09K 13/08 |

OTHER PUBLICATIONS

Office Action mailed Oct. 28, 2021 in Taiwanese Application No. 110109750.
Search Report mailed Jun. 30, 2020 in corresponding International Application No. PCT/JP2020/016071.

* cited by examiner

[FIG. 1]
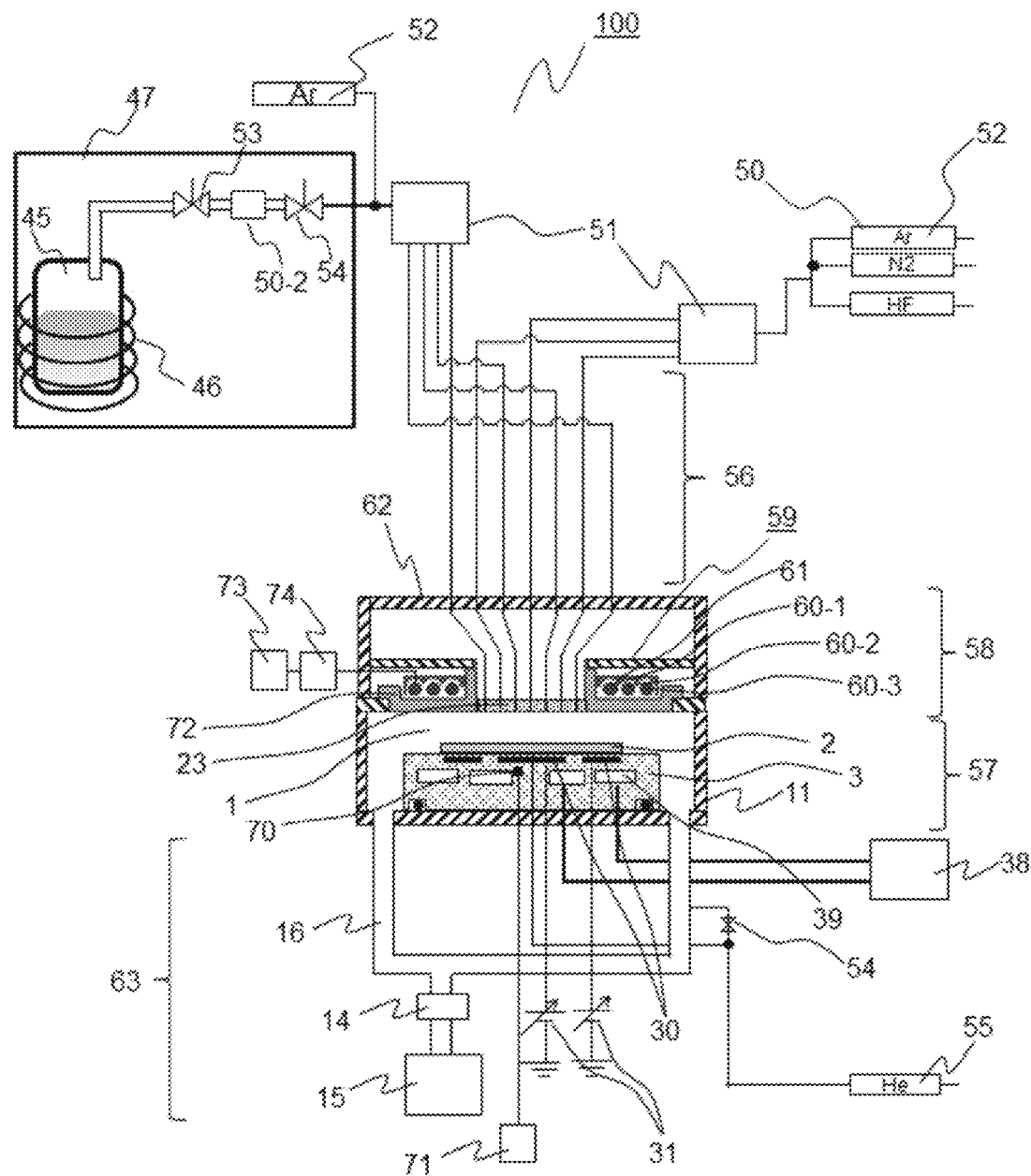

[FIG. 3]
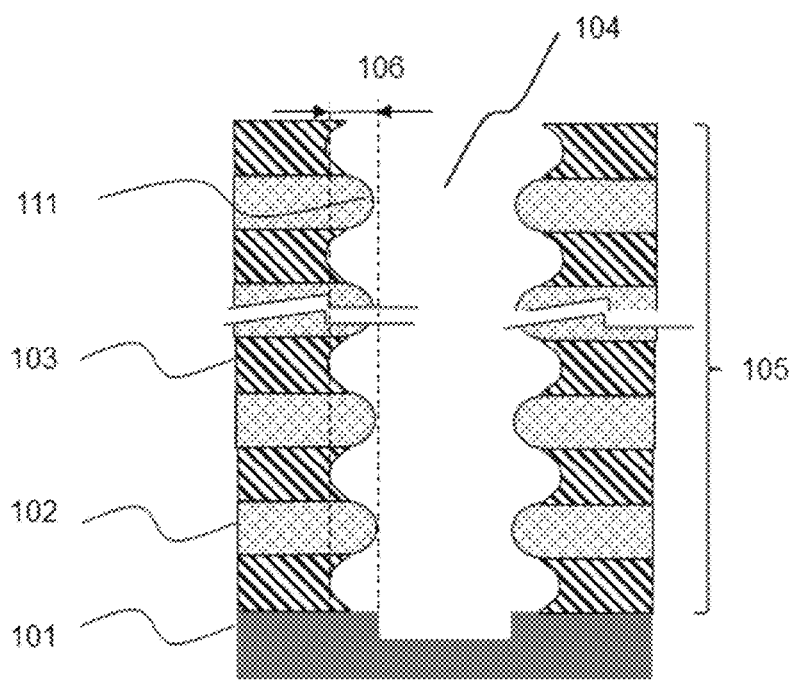

[FIG. 4]
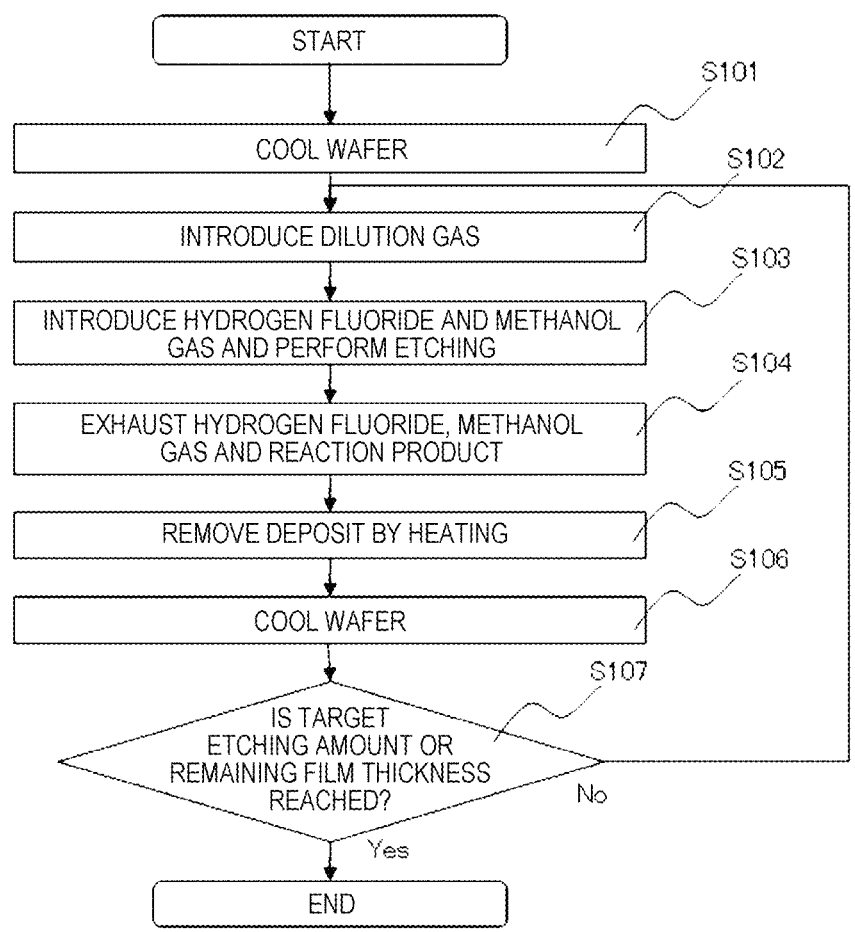

[FIG. 5]
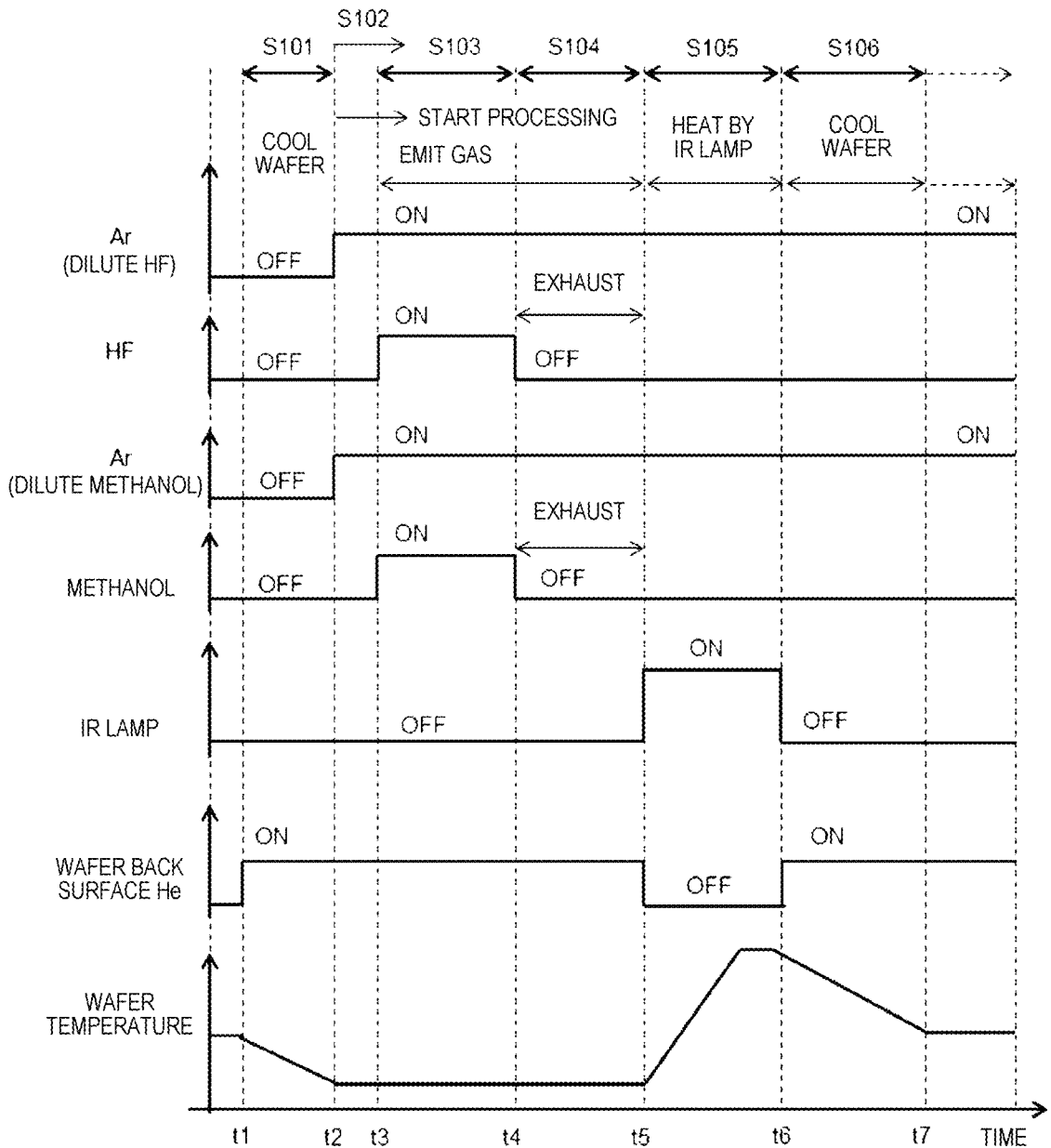

[FIG. 6]
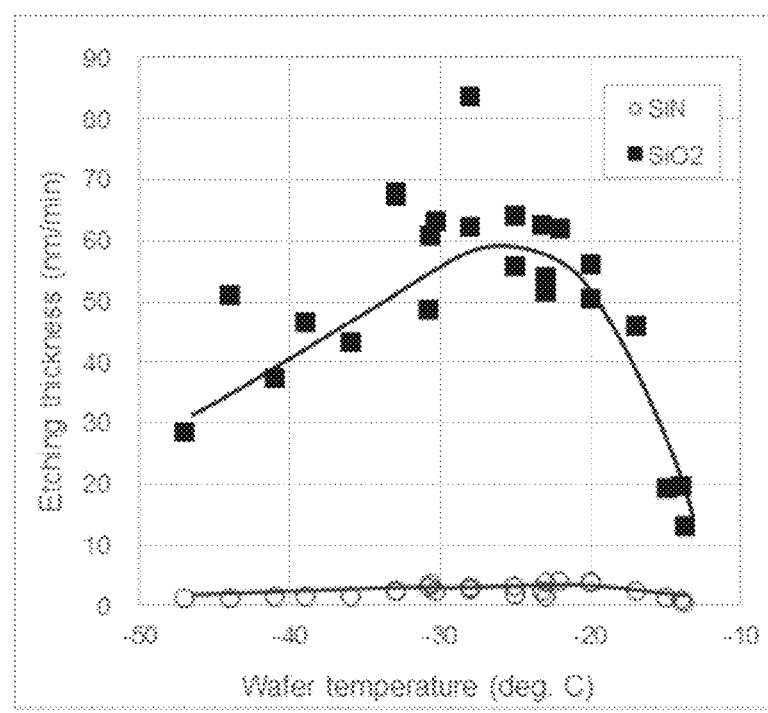

[FIG. 7]
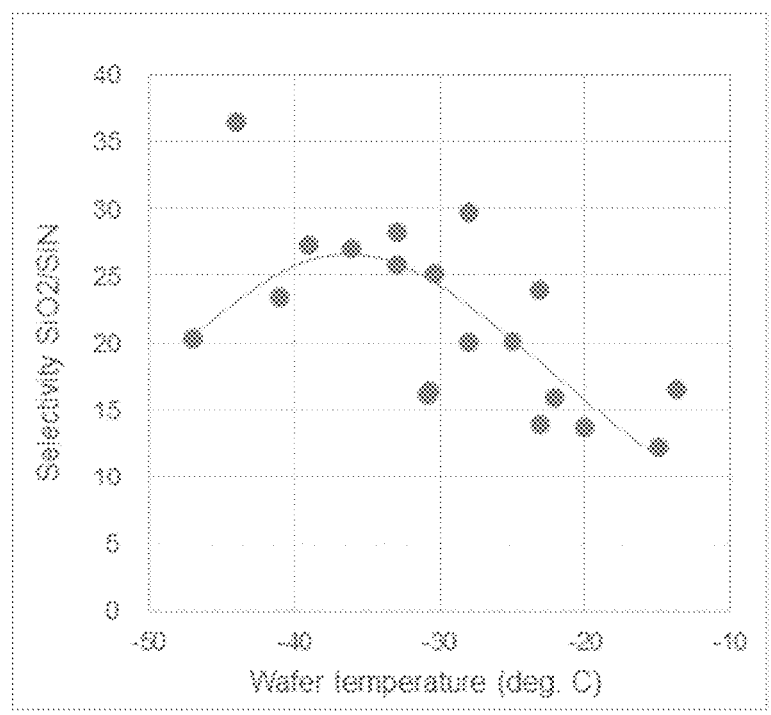

[FIG. 8]
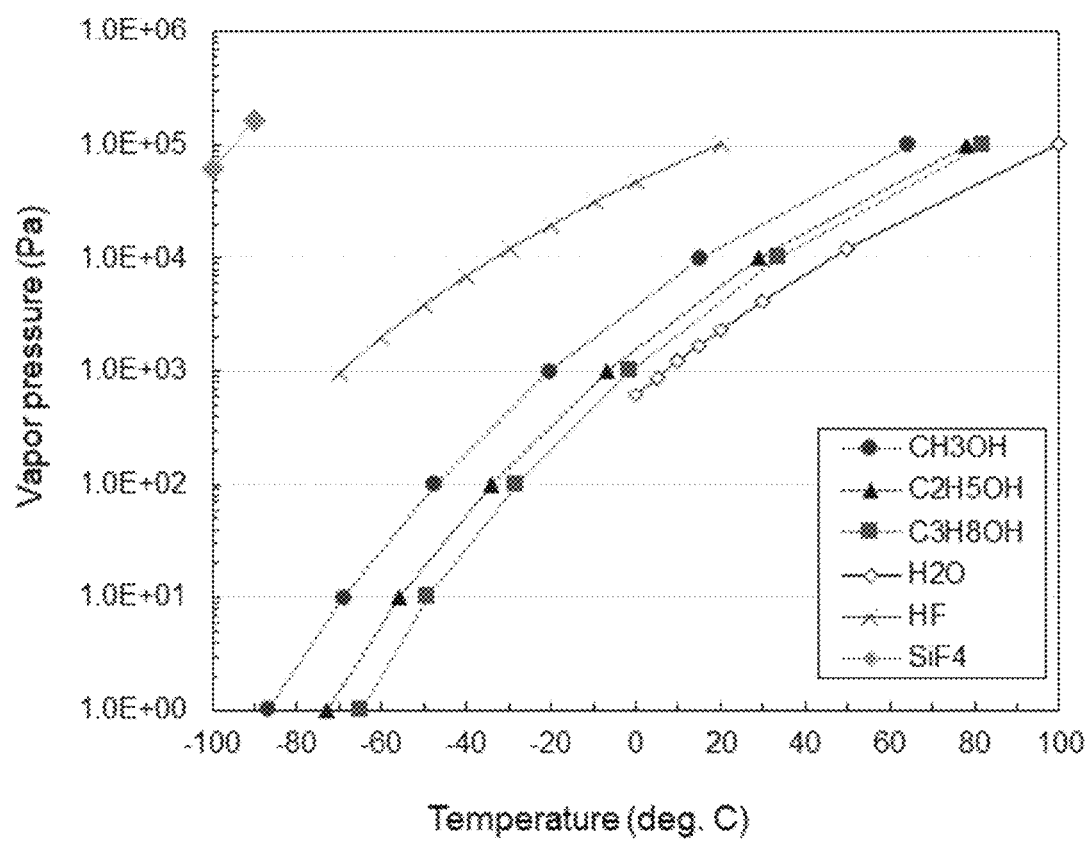

[FIG. 9]
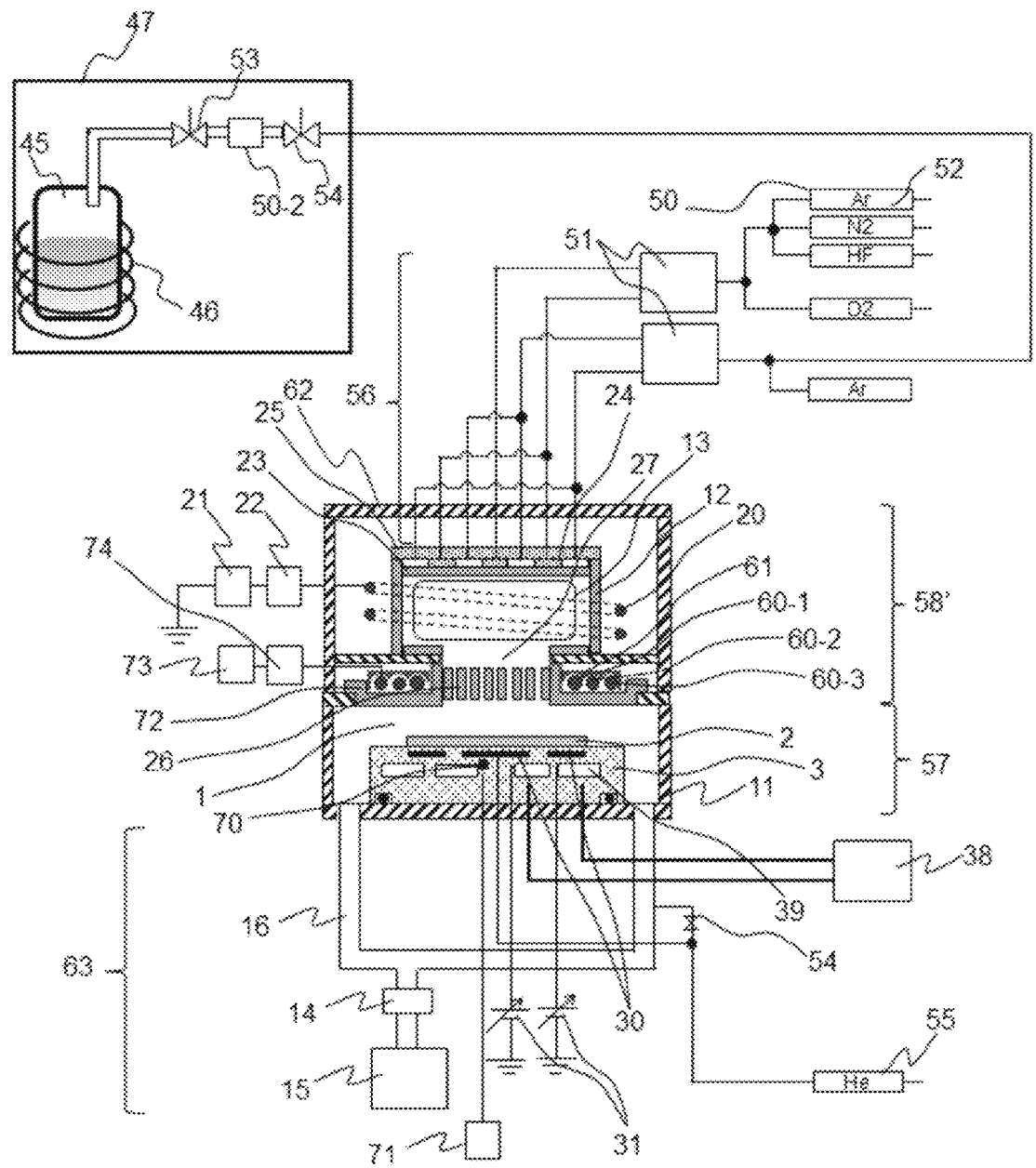

[FIG. 10]
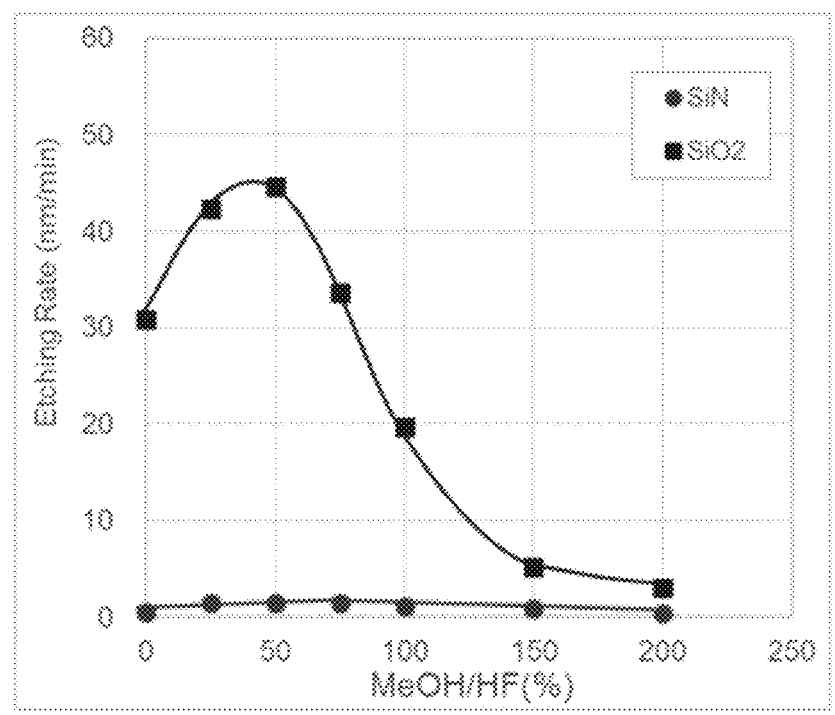

ETCHING METHOD

TECHNICAL FIELD

The present invention relates to an etching method of etching and removing a silicon oxide film to be processed which is formed in advance on a sample such as a semiconductor wafer on a substrate in a process of manufacturing a semiconductor device, and particularly to an etching method of isotropically dry etching a silicon oxide film in a film structure including a plurality of silicon oxide films stacked in a vertical direction and an interlayer film between the silicon oxide films.

BACKGROUND ART

A semiconductor device used in a storage device and the like is being further miniaturized and a device structure is being made three-dimensional in order to meet a demand from a market such as low power consumption and increased storage capacity. In manufacture of such a semiconductor device, in a process of forming the three-dimensional structure, since the structure is three-dimensional and complicated compared to the related art, it is considered that in addition to "vertical (anisotropic) etching" in which the etching is performed on upper and lower surfaces of a wafer in a vertical direction, which is performed in the related art, "isotropic etching" in which the etching is also performed in a lateral direction is frequently used.

In the related art, such isotropic etching is performed by wet processing using a chemical solution. However, with progress of the miniaturization of the device structure, problems such as collapse of a pattern of the structure due to surface tension of the chemical solution and etching residue in a gap between patterns become apparent. Further, there is a problem in that a large amount of chemical solution processing is required. Therefore, in the isotropic etching, it is required to replace the wet processing using the chemical solution with dry processing not using the chemical solution.

Since a silicon oxide film is often used in the semiconductor device, there are many known examples of a dry etching process thereof in the related art. For example, PTL 1 discloses that a silicon oxide-based material layer is etched by using plasma at 0° C. or lower using alcohol and CF-based gas. PTL 2 discloses that in a deposit removing method, etching is performed at 30° C. or lower using mixed gas of hydrogen fluoride and methanol. Further, PTLs 3, 4, 5, and 6 disclose that a silicon oxide film is etched at a temperature of 0° C. to 30° C. or a room temperature to 40° C. by using hydrogen fluoride and alcohol, and PTLs 3, 4, 5, and 6 disclose contents related to silicon nitride.

PTL 7 discloses that a structure body including a silicon oxide film formed on a silicon nitride film is etched using $HF_2^-$ generated from hydrogen fluoride and alcohol, and then the structure body is heated and further cooled. Further, PTL 8 discloses that a silicon nitride film is selectively etched in a lateral direction using a precursor containing oxygen and a precursor containing fluorine at a temperature of −20° C. or less from a structure in which the silicon nitride film and a silicon oxide film are stacked.

CITATION LIST

Patent Literature

PTL 1: JP-A-07-169738
PTL 2: JP-A-2013-074220
PTL 3: JP-A-2016-025195
PTL 4: U.S. Pat. No. 9,613,823
PTL 5: JP-A-07-153737
PTL 6: U.S. Pat. No. 5,571,375
PTL 7: JP-A-2005-161493
PTL 8: U.S. Pat. No. 10,319,603

SUMMARY OF INVENTION

Technical Problem

The technique in the related art described above has a problem because of insufficient consideration of the following points.

That is, in stacked film processing of a 3D-NAND flash memory which is a semiconductor element having a three-dimensional structure, and processing around a gate of a Fin-type FET, there is a demand for a technique of etching an oxide film by controlling an amount of processing at an atomic layer level with high selectivity with respect to a polycrystalline silicon film or a silicon nitride film. In a process of manufacturing such a 3D-NAND flash memory, as a typical example of a structure to be processed and the etching processing thereof, it takes into consideration a step of etching the silicon oxide film in the lateral direction selectively from a surface of a stacked film structure constituting a side wall surface of a structure of a hole or a groove which is a structure in which a shape of the deep hole or the groove is formed in a vertical direction from a uppermost surface of a structure in which the silicon oxide film (SiOx film) and the silicon nitride film (SiN) are alternately stacked in the vertical direction.

As described in the background art, in the etching by the wet processing using an aqueous solution of hydrofluoric acid or an aqueous solution of buffered hydrofluoric acid, there is a problem such as the etching residue in a structure of a groove having a minute interval or a hole having a minute diameter and poor etching controllability. Further, when the techniques in the related art disclosed in PTLs 1 to 7 are applied to the film structure described above in which the plurality of silicon oxide films (former) and the plurality of silicon nitride films (latter) are alternately stacked in the vertical direction, there is a problem that it is difficult to implement high selectivity to the latter with respect to the former and to efficiently (at a high etching rate) process the former with respect to the latter.

The invention has been made in view of the technical problem described above, and provides an etching method for etching a silicon oxide film with a high accuracy at a high selection ratio with respect to a silicon nitride film.

Solution to Problem

The object described above is implemented by providing an etching method of etching a film structure, in which an end portion of a film layer in which a silicon oxide film and a silicon nitride film formed in advance on a wafer disposed in a processing chamber are alternately stacked in a vertical direction forms a side wall of a groove or a hole, by supplying processing gas into the processing chamber, the method including a step of supplying hydrogen fluoride and alcohol vapor into the processing chamber, maintaining the wafer at a temperature in a range of −30° C. and −50° C. and the pressure of the processing chamber in a range of 100 Pa and 1000 Pa, and etching the silicon oxide film from the end portion in a lateral direction, and a step of removing deposits of ammonium hexafluorosilicate derived from materials of the silicon nitride film, after the step of etching the silicon oxide film.

Advantageous Effect

It is possible to achieve both etching of the silicon oxide film at a high etching rate and etching of the silicon nitride film at a low etching rate. Accordingly, the silicon oxide film can be etched and removed with high accuracy at a high selection ratio with respect to the silicon nitride film.

BRIEF DESCRIPTION OF DRAWINGS

FIG. 1 is a vertical cross-sectional view schematically showing an outline of a configuration of an etching processing apparatus according to an embodiment.

FIG. 3 is a vertical cross-sectional view schematically showing a cross section of a state in which an undesirable end portion shape is generated in the film structure formed on the wafer to be processed in the etching processing apparatus according to the embodiment shown in FIG. 1.

FIG. 4 is a flowchart showing an outline of a flow of wafer processing performed in the etching processing apparatus according to the embodiment shown in FIG. 1.

FIG. 5 is a time chart showing an outline of a flow of an operation of the wafer processing shown in FIG. 4 with a lapse of time.

FIG. 6 is a graph showing a reference example of a change in an etching speed with respect to a change in a wafer temperature when a silicon oxide film on the wafer disposed in a processing chamber is etched using mixed gas of hydrogen fluoride and methanol in a plasma processing apparatus according to the present embodiment.

FIG. 7 is a graph showing a change in a selection ratio between the silicon oxide film and the silicon nitride film with respect to the change in the wafer temperature in the reference example shown in FIG. 6.

FIG. 8 is a graph showing changes in vapor pressure with respect to temperatures of a plurality of types of alcohols, water, hydrogen fluoride, and silicon tetrafluoride.

FIG. 9 is a vertical cross-sectional view schematically showing an outline of an overall configuration of an etching processing apparatus according to another embodiment of the invention.

FIG. 10 is a graph showing a relationship between an etching rate of a film to be processed and an amount of methanol with respect to hydrogen fluoride used as processing gas in etching processing performed by the etching processing apparatus according to another embodiment shown in FIG. 9.

DESCRIPTION OF EMBODIMENTS

Figure 2A:
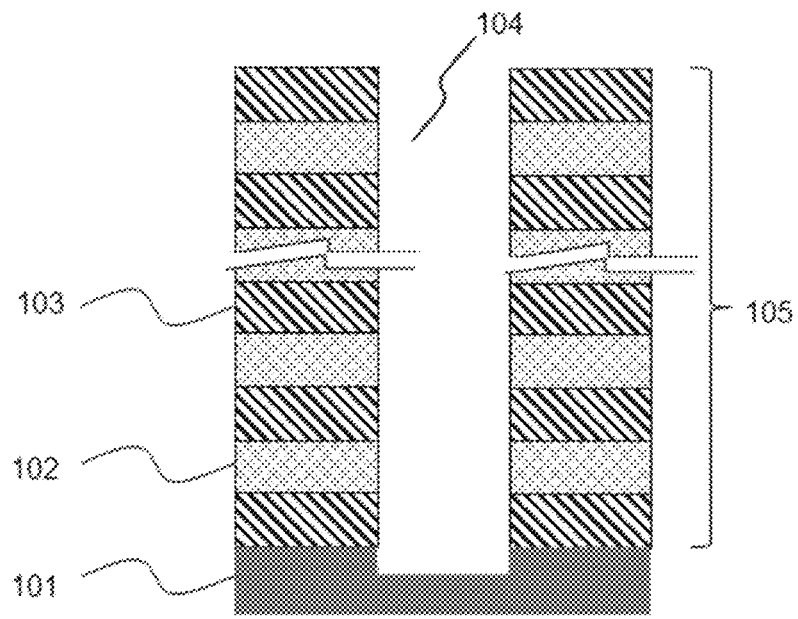
FIGS. 2A and 2B are vertical cross-sectional views schematically showing an outline of a configuration of a film structure formed on a wafer to be processed in the etching processing apparatus according to the embodiment shown in FIG. 1.

Inventors have conducted detailed studies on etching of a silicon oxide film and a silicon nitride film by hydrogen fluoride gas and alcohol. Reaction formulas in a case where the hydrogen fluoride gas and methanol used as alcohol are used for the silicon oxide film are shown below as described in PTL 7.

$$2HF+CH_3OH \rightarrow HF_2^- + CH_3OH_2^+ \quad \text{(Formula 1)}$$

$$SiO_2+2HF_2^-+CH_3OH_2^+ \rightarrow SiF_4+2H_2O+2CH_3OH \quad \text{(Formula 2)}$$

As shown in these formulas, 2 parts of hydrogen fluoride (HF) and methanol ($CH_3OH$) react to produce an active species of $HF_2^-$ (Formula 1). This $HF_2^-$ reacts with $SiO_2$ to produce $SiF_4$ (boiling point $-94.8°$ C.), and $SiF_4$ volatilizes to cause the etching. $HF_2^-$ is responsible for the reaction. Alcohol such as methanol play a function of abstracting $H^+$ from two parts of hydrogen fluoride to produce $HF_2^-$.

The inventors have studied an etching rate of a single layer film of each of the silicon oxide film and the silicon nitride film formed by plasma CVD in a case of using the mixed gas of hydrogen fluoride and methanol while changing the conditions. Results thereof will be described with reference to FIGS. 6 to 8.

FIG. 6 is a graph showing a reference example of a change in an etching speed with respect to a change in a wafer temperature when a silicon oxide film on the wafer disposed in a processing chamber is etched using mixed gas of hydrogen fluoride and methanol in a plasma processing apparatus according to the present embodiment. FIG. 7 is a graph showing a change in a selection ratio between the silicon oxide film and the silicon nitride film with respect to the change in the wafer temperature in the reference example shown in FIG. 6. FIG. 8 is a graph showing changes in vapor pressure with respect to temperatures of a plurality of types of alcohols, water, hydrogen fluoride, and silicon tetrafluoride.

In the example shown in FIG. 6, the gases used in the etching processing of the respective single layer films are 800 sccm of hydrogen fluoride, 400 sccm of methanol, and those obtained by adding 100 sccm of Ar which is dilution gas to each of hydrogen fluoride and methanol, that is, 200 sccm of Ar in total. Further, pressure at which the wafer is processed in the processing chamber is 300 Pa.

As shown in FIG. 6, it can be seen that as the temperature of the wafer changes to a lower temperature, the etching speed (etching rate) of the silicon oxide film largely changes with respect to an amount of the change in the etching speed (etching rate) of the silicon nitride film. Particularly, the etching rate of the silicon oxide film is rapidly increased at $-15°$ C. or lower. It is considered that this is because an adsorption amount of hydrogen fluoride and methanol to the silicon oxide film increases, and the reactions represented by the formulas (1) and (2) easily occur.

In contrast, the etching rate of the silicon nitride film remains small and does not change even at the low temperature of $-15°$ C. or lower. As a result, as shown in FIG. 7, it can be seen that the selection ratio between the silicon oxide film and the silicon nitride film tends to increase as the temperature decreases in a region a processing temperature is $0°$ C. or lower, and in particular, has a range of a high selection ratio including a maximum value at $-30°$ C. to $-50°$ C.

On the other hand, the practical etching rate of the silicon oxide film derived from a plurality of pieces of data of the reference example shown in FIG. 6 has a maximum value at a temperature range between $-25°$ C. and $-30°$ C., and gradually decreases at a lower temperature, particularly, at a temperature of $-45°$ C. or lower. Then, it is shown that a value of the selection ratio indicated by a solid line shown in FIG. 7 becomes a maximum value at a temperature range between $-35°$ C. to $40°$ C., and decreases as the temperature becomes lower. In this way, it can be seen that the selection ratio of the etching rate of the silicon oxide film with respect to the silicon nitride film is large in a range of $-20°$ C. to −50° C., and in particular is in a large range including the maximum value at −30° C. to −45° C.

Here, when a curve (FIG. 8) in which a literature value of the vapor pressure with respect to the temperature of alcohol or the hydrogen fluoride gas is graphed is observed, the vapor pressure of alcohol decreases at a temperature lower than −50° C. and becomes lower than 100 Pa. In a process of using the hydrogen fluoride gas and methanol, about 100 Pa to 1000 Pa is used as total pressure, and when considered as partial pressure, several tens to several hundreds of Pa are required.

For example, in the examples shown in FIGS. 6 and 7 in which the processing is performed using 300 Pa as the total pressure, the partial pressure of about 100 Pa is required. On the other hand, when the temperature is −50° C. or lower, the vapor pressure of alcohol becomes too low, and thus the etching rate is considered to decrease.

As described above, it can be found that both the high etching rate of the silicon oxide film and the low etching rate of the silicon nitride film can be achieved, and in order to etch the silicon oxide film with high accuracy at a high selection ratio with respect to the silicon nitride film, the wafer temperature is preferably −20° C. to −60° C., and more preferably −30° C. to −50° C.

First Embodiment

Hereinafter, embodiments of the invention will be described in detail with reference to the drawings.
[Etching Processing Apparatus]

First, an outline of an overall configuration of an etching processing apparatus according to a first embodiment of the invention will be described with reference to FIG. 1. FIG. 1 is a vertical cross-sectional view schematically showing the outline of the configuration of the etching processing apparatus according to the present embodiment.

In the present figure, an etching processing apparatus 100 includes a lower unit 57 including a base chamber 11 which is a cylindrical metal vacuum container including a central axis in a vertical direction, and an upper unit 58 which is placed on the base chamber 11 and constitutes a circular ceiling surface of the base chamber 11. Further below, a vacuum exhaust unit 63 including an exhaust pump that exhausts an inside of the base chamber 11 to reduce pressure is disposed.

Inside the base chamber 11, a processing chamber 1 is disposed which is a space surrounded by a side wall and a bottom portion thereof and whose inside is depressurized. Inside the processing chamber 1 having a cylindrical shape, a wafer stage 3, which is a support table having a cylindrical shape and on which a wafer 2 is placed on an upper surface thereof, is disposed. At least one through hole communicating the inside and an outside of the processing chamber 1 is disposed in the bottom portion of the base chamber 11 on an outer peripheral side of the wafer stage 3, and an opening of the through hole constitutes an exhaust port through which gas or particles inside the processing chamber 1 are discharged.

Further, a shower plate 23 which is a circular plate made of a dielectric material such as quartz and is a central portion of the ceiling surface of the processing chamber 1 is disposed above the upper surface of the wafer stage 3 with a space into which gas for processing a film layer on a surface of the wafer 2 is introduced sandwiched therebetween so as to face the upper surface, and constitutes a top surface of the processing chamber 1 as the upper unit 58. A plurality of through holes are provided in the shower plate 23, and processing gas is supplied into the processing chamber 1 through the through holes. The processing gas of the present embodiment is mixed gas in which a plurality of types of elements including at least one type of reactive gas reacting with a film layer to be processed disposed in advance on the surface of the wafer 2 and dilution gas that dilutes the reactive gas to a predetermined ratio are mixed with each other.

A flow rate or a speed of the processing gas is adjusted for each gas type by a mass flow controller 50 disposed for each gas type on a pipe line for supplying the processing gas which is disposed to communicate with the through holes of the shower plate 23. A plurality of gas pipes are combined into one, and the gas is merged and is supplied to the through holes of the shower plate 23 as the processing gas. Further, a gas distributor 51 is disposed further downstream of the pipe line for supplying the processing gas merged on a downstream side of the mass flow controller 50, and between the gas distributor 51 and the shower plate 23, gas supply pipes 56 serving as a plurality of pipe lines for supplying the gas are connected to the gas distributor 51 and the shower plate 23, and lower ends of these pipe lines are disposed to communicate with through holes disposed in a central portion or an outer peripheral portion of the shower plate 23.

In the present embodiment, the processing gas whose flow rates and compositions are independently adjusted at the central portion and the outer peripheral side portion is supplied into the processing chamber 1 from the upper central portion through each of the gas supply pipes 56 disposed to communicate with the through holes of the shower plate 23, and distribution of a partial pressure of the processing gas is adjusted to a desired distribution in each of regions in the vicinity of the center and in the vicinity of the outer periphery of the processing chamber 1. The example of FIG. 1 describes Ar, $N_2$, HF, and $O_2$ as elements which are raw materials for the processing gas, but the processing gas formed of other types of elements may also be supplied.

Further, in the present embodiment, gas obtained by vaporizing a liquid raw material is supplied as the processing gas into the processing chamber 1 through the through holes of the shower plate 23. For example, a predetermined type of alcohol is used as the liquid raw material, and the gas obtained by vaporizing these raw material liquids stored in a storage unit in a vapor feeder 47 is used as the processing gas.

A tank 45 in which the raw material liquid is stored is provided inside the vapor feeder 47. The liquid raw material is heated by heat generated by supplying electric power to a heater 46 disposed around an outer wall of the tank 45, and a raw material vapor is generated in an upper portion of an inside of the tank 45. The raw material vapor filled in the inside is supplied to the gas distributor 51 for vapor through a pipe line connected to the upper portion of the tank 45 with a flow rate or a speed thereof controlled by a mass flow controller 50-2, and is distributed to a part of the plurality of gas supply pipes 56 communicating with predetermined through holes among the plurality of through holes of the shower plate 23. Further, the raw material vapor is introduced into the processing chamber 1 through these gas supply pipes 56 and the through holes of the shower plate 23.

While the processing gas formed by the raw material vapor is not introduced into the processing chamber 1, at least one of valves 53 and 54 on the pipe line connecting the gas distributor 51 and the tank 45 is closed to block the liquid raw material from the processing chamber 1. In the present example, the heater 46 for heating is provided on an outer periphery of the tank 45, but it is desirable that a heater is also disposed on the pipe through which the raw material vapor flows, and an inside of the pipe is heated by receiving heat from the heater so that the raw material vapor is not condensed inside the pipe.

In a lower portion of the processing chamber 1 in the base chamber 11, an exhaust unit 15 including the exhaust pump that exhausts the inside of the processing chamber 1 to reduce pressure communicates with and is connected to a lower portion of the wafer stage 3 via a vacuum exhaust pipe 16. The exhaust unit 15 includes, for example, the exhaust pump such as a turbo molecular pump, a mechanical booster pump, and a dry pump that can depressurize the inside of the processing chamber 1 to a predetermined vacuum degree. Further, in order to adjust the pressure inside the processing chamber 1, a pressure adjusting unit 14 is disposed on the vacuum exhaust pipe 16 which connects and communicates between exhaust ports communicating with a bottom material of the base chamber 11 and the exhaust unit 15. The pressure adjusting unit 14 includes at least one plate-shaped flap disposed so as to cross a flow path through which gas to be exhausted of the vacuum exhaust pipe 16 flows in a lateral direction, and increases or decreases a flow rate or a speed of the gas to be exhausted flowing inside by increasing or decreasing a flow path cross-sectional area by rotating the flap or moving the flap in a direction crossing the flow path.

For attachment of the base chamber 11 and the cylindrical upper unit 58 above the base chamber 11, an outer periphery end portion of a bottom surface of the cylindrical upper unit 58 is attached on an upper end of the cylindrical side wall of the base chamber 11 so as to airtightly seal an inside and an outside of the processing chamber 1 with a seal member such as an O-ring sandwiched therebetween. The shower plate 23 is disposed in the central portion of the lower portion of the upper unit 58, and an IR lamp unit 59 having a ring shape is disposed in a region on the outer peripheral side of the shower plate 23, and an IR light transmission window 72 of the IR lamp unit 59 constitutes the top surface of the processing chamber 1, which is a lower surface of the upper unit 58. Further, the upper unit 58 includes a cylindrical upper unit cover 62 made of metal surrounding the IR lamp unit 59, the shower plate 23 disposed at the central portion of the upper unit 58, and the periphery and the upper side of the gas supply pipe 56 connected to the shower plate 23 above the shower plate 23.

In the present example, the IR lamp unit 59 is provided above the outer peripheral side region of the upper surface of the wafer stage 3 so as to surround the upper surface and the wafer 2 mounted thereon in a ring shape, and a light transmitted through the IR light transmission window 72 and emitted into the processing chamber 1 is emitted to the wafer 2 from the periphery. The emitted light emits light (herein, referred to as IR light) mainly from visible light to light in an infrared light region.

The IR lamp unit 59 includes an IR lamp 60 disposed in a ring shape around the shower plate 23, a ring-shaped reflection plate 61 which is disposed above the IR lamp 60 to cover the IR lamp 60 and reflects the emitted IR light toward a center side and a lower direction (direction of the placed wafer 2) of the processing chamber 1, and the IR light transmission window 72 which is disposed below the IR lamp 60 and surrounds the shower plate 23 with a ring-shaped member made of the dielectric material such as quartz through which the IR light is transmitted. In the IR lamp 60 of the present example, circular-type (circular) IR lamps 60-1, 60-2, and 60-3 are used in which a plurality of lamps are concentrically disposed around a center of the shower plate 23 or the processing chamber 1 in the vertical direction when viewed from above. Instead of the plurality of lamps, one lamp disposed in a spiral shape may be used. Further, in the present embodiment, the lamps for 3 loops are provided, whereas lamps for 2 loops and 4 loops may be used.

An IR lamp power supply 73 that supplies the electric power is connected to the IR lamp 60, and a radio frequency cut filter 74 for reducing noise of radio frequency power and prevent the high-frequency power from flowing into the IR lamp power supply 73 is disposed on a power supply path electrically connecting the IR lamp 60 and the IR lamp power supply 73. Further, the IR lamp power supply 73 has a function of independently controlling the electric power supplied to each of the IR lamps 60-1, 60-2, and 60-3.

The IR lamp unit 59 surrounding the shower plate 23 in the ring shape includes a top surface portion of the IR light transmission window 72 facing the ring-shaped processing chamber 1, and a cylindrical inner peripheral side wall portion which is connected to an upper side of an inner periphery end portion thereof and surrounds the shower plate 23 and the gas supply pipes 56 connected to the through holes on a rear surface side thereof. Similarly to the top surface portion, the cylindrical inner peripheral side wall portion is also made of a dielectric member through which the IR light is transmitted, and the emitted IR light is emitted to the shower plate 23 through the cylindrical portion and is emitted into the processing chamber 1 through the shower plate 23.

Inside a circular plate or a cylindrical metal member of the wafer stage 3, a flow path 39 through which a coolant for cooling the wafer stage 3 to adjust the temperature flows is disposed, and the coolant whose temperature is adjusted to a value within a predetermined range is supplied and circulated in a chiller 38 connected to an inlet and outlet of the flow path 39. As the chiller of the present embodiment, a chiller capable of setting a coolant or a metal member to a temperature in a range of −20° C. to −60° C. is used. Further, a dielectric film constituting an upper surface on which the wafer 2 is placed is disposed on an upper surface of the metal member, and a plurality of plate-shaped electrode plates 30 to which DC power for fixing the wafer 2 by static adsorption is supplied are built in the dielectric film. DC power supplies 31 are respectively connected to the electrode plates 30.

In order to efficiently adjust the temperature of the wafer 2, a supply port through which He gas is supplied is disposed on the upper surface of the dielectric film of the wafer stage 3, and the He gas is supplied between a back surface of the wafer 2 and the dielectric film in a state where the wafer 2 is placed, so that heat transfer between the wafer 2 and the flow path 39 can be promoted. Further, the dielectric film is made of a resin such as polyimide in order to prevent the back surface of the wafer 2 from being damaged even when the wafer 2 is heated or cooled in a state where the wafer 2 is electrostatically attracted to the dielectric film.

A thermocouple 70 serving as a temperature detector (sensor) that detects the temperature of the wafer stage 5 or the metal member is disposed inside the metal member of the wafer stage 3 and is connected to a thermocouple thermometer 71. An output from the thermocouple thermometer 71 is transmitted to a control unit (not shown) that controls an operation of the etching processing apparatus 100, and an arithmetic unit in the control unit detects a value of the temperature based on an algorithm described in predetermined software stored in a storage device, and transmits a command signal for independently adjusting an output of the IR light from each of the IR lamps 60-1, 60-2, and 60-3 to the IR lamp power supply 73 so as to obtain a desired temperature distribution of the wafer 2 in accordance with a difference between the detected value and the desired temperature distribution in a radial direction of the wafer 2 obtained from the detected value.

In the etching processing apparatus 100 of the present embodiment, a Peltier element or the like which is a thermoelectric conversion device that forms a temperature difference in accordance with the electric power supplied to the inside of the wafer stage 3 may be used in addition to a configuration in which the coolant circulates inside the flow path 39 in which the coolant circulates. Further, an inner side wall surface of the processing chamber 1 other than the wafer stage 3 which is exposed to the processing gas such as the hydrogen fluoride gas and the methanol gas can be heated to a temperature in a range of, for example, 40° C. to 120° C. Accordingly, it is possible to prevent adsorption of the hydrogen fluoride gas and the methanol gas to a surface of an internal member of the processing chamber 1, and to reduce occurrence of corrosion in the internal member.

Figure 2B:
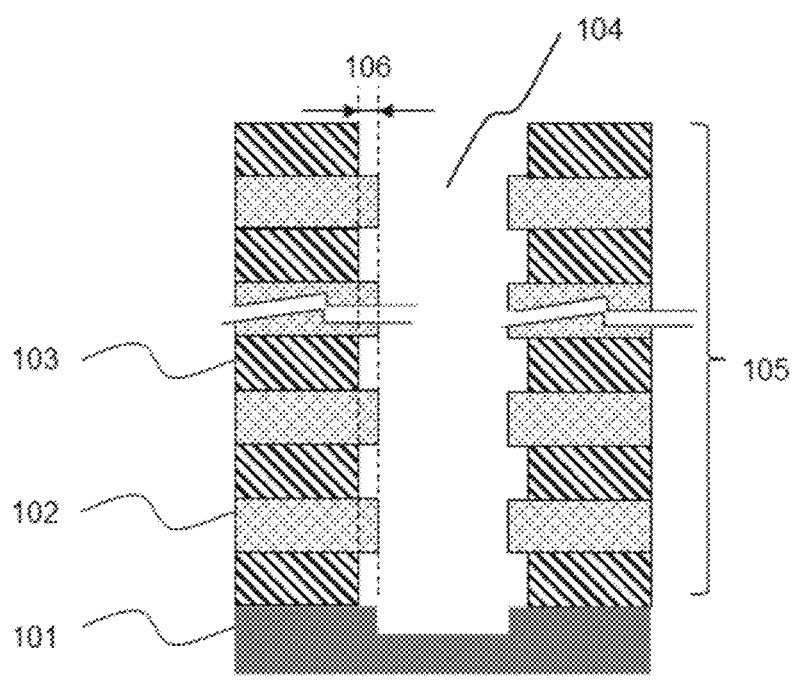

A structure of a film to be processed on the wafer 2 by the etching processing apparatus 100 of the present embodiment will be described with reference to FIG. 2. FIG. 2 is a vertical cross-sectional view schematically showing an outline of a configuration of the film structure formed on the wafer to be processed in the etching processing apparatus according to the embodiment shown in FIG. 1. FIG. 2A shows a vertical cross section of the film structure before a start of the processing, and FIG. 2B shows a vertical cross section of the film structure after a predetermined time from the start of the processing.

As shown in FIG. 2A, the film structure to be etched in the present embodiment has a configuration in which a plurality of silicon oxide films ($SiO_2$ films) 103 which are film layers to be processed and a plurality of silicon nitride films (SiN) 102 are alternately stacked on a substrate 101. In the present example, silicon nitride SiN represents a substance that can be represented by an element symbol of SixNy, and typical examples thereof include, for example, $Si_3N_4$.

In the film structure, a hole shape or a groove shape having a depth penetrating the film structure from an upper surface to the substrate 101 in the vertical direction is formed, the hole or the groove has an opening 104, and a cross section (vertical cross section) of each of the plurality of silicon oxide films ($SiO_2$ films) 103 and the plurality of silicon nitride films (SiN) 102 alternately stacked is exposed on a side wall surface thereof. Further, in the present example, the hole or the groove structure is also formed in an upper portion of the substrate 101 below the plurality of stacked films to form the opening 104.

Such a film structure is typically used in a semiconductor device for storage using a 3D-NAND technique. A film thickness of the silicon oxide film 103 used in the present example is set to a value in a range of several nm to 100 nm, and a film thickness of the silicon nitride film 102 is set to a value in a range of several nm to 100 nm. The number of the stacked films in the film structure is set to a value in a range of several tens to several hundreds. Further, a thickness 105 of the entire film structure of these stacked film layers is several μm to several tens of μm, and a width of the opening 104 has a value in a range of several tens of nm to several hundreds of nm.

In the etching processing apparatus 100 of the present embodiment, for the stacked film of such a film structure, the silicon oxide films 103 of the stacked films are isotropically etched from the cross section of the side wall surface of the opening 104 at a high selection ratio with respect to the silicon nitride films 102. At this time, since an etching amount of the silicon nitride film 102 is significantly smaller than that of the silicon oxide film 103, the etching of the silicon oxide film 103 proceeds in a lateral (horizontal) direction (horizontal direction in the drawing) with respect to the vertical cross section of the opening 104 of the silicon nitride film 102. FIG. 2B shows the vertical cross section of the film structure when a predetermined time is elapsed from the start of the etching from the state shown in FIG. 2A, and an etching amount 106 of the silicon oxide film 103 at this time is several nm to several tens of nm, and is optimally about 10 nm.

In the etching processing of the present embodiment, a ratio (selection ratio) of the etching amount of the silicon oxide film 103 in the lateral direction with respect to that of the silicon nitride film is set to 15 or more, and more preferably 20 or more. When the selection ratio is low, the etching of the silicon nitride film 102 which is not the target of the etching is performed in parallel and a considerable amount occurs. Therefore, as shown in FIG. 3, a shape of the cross section facing the opening 104 of the silicon nitride film 102 after the predetermined etching time is changed from an initial flat planar shape (shown as a rectangular shape in the drawing) to a shape in which upper and lower end portions of the cross section are consumed (rounded), and there is a possibility that a performance of the device including a structure of a processed circuit having such a shape is adversely affected.

FIG. 3 schematically shows a cross section of the film structure in which such an undesirable end portion shape is generated. FIG. 3 is a vertical cross-sectional view schematically showing the cross section of a state in which the undesirable end portion shape is generated in the film structure formed on the wafer to be processed in the etching processing apparatus according to the embodiment shown in FIG. 1.

Empirically, when the selection ratio is 15 or more, more preferably 20 or more, a shape closer to a rectangle can be obtained as shown in FIG. 2B. Further, when the selection ratio is less than 15, particularly 10 or less, the shape of the etched end portion of the silicon nitride film 102 as shown in FIG. 3 becomes a rounded shape in which a middle portion is recessed from upper and lower sides of the film in the direction of the etching, which is not desirable as the shape of the circuit formed using the film. For this reason, in order to obtain a high selection ratio (selectivity) required for implementing a desired performance of the circuit of the semiconductor device to be formed, the temperature of the wafer 2 is preferably −20° C. to −50° C.

As the substrate 101 shown in FIG. 2, a substrate made of silicon, a substrate made of silicon germanium, a substrate made of a material containing these materials, and the like are preferable, but the substrate is not limited thereto. Further, the film structure to be processed of the present example has a configuration in which a large number of silicon oxide films ($SiO_2$ films) 103 and a large number of silicon nitride films (SiN) 102 are alternately stacked, and these film layers are continuously formed in the vertical direction by a plasma CVD and the like. The silicon oxide films 103 and the silicon nitride films 102 may be formed by other methods such as a chemical vapor deposition method (CVD method), an atomic layer deposition method (ALD method), a sputtering method, a precursor coating method, and a firing method.

Further, as another problem, when etching the film structure in which the end portion of the film layer, in which the silicon oxide films 103 to be etched is vertically stacked on the silicon nitride film 102, forms the side wall inside the groove or the hole, a deposit may be generated on the surface of the film structure. In this case, an electromagnetic wave (IR light) from the IR lamp 60 is emitted to the wafer 2 to heat the wafer 2, the temperature of the wafer 2 is raised to a temperature equal to or higher than a naturalization temperature of the deposit, and the generated deposit can be thermally decomposed and desorbed. In the present embodiment, the heating by the emission of the IR light from the IR lamp 60 is used for heating the wafer 2, but the heating is not limited thereto. For example, the wafer 2 may be heated by heating the wafer stage 3, or may be transferred to another device only performing the heating from the inside of processing chamber 1 to perform the heating. Further, when the IR lamp 60 is emitted, Ar gas or nitrogen gas may be introduced into the processing chamber 1 or another heating device.

[Etching Process]

Next, an etching process proposed in the invention will be described with reference to FIGS. 1, 4, and 5. FIG. 4 is a flowchart showing an outline of a flow of wafer processing performed in the etching processing apparatus according to the embodiment shown in FIG. 1. FIG. 5 is a time chart showing an outline of a flow of an operation of the wafer processing shown in FIG. 4 with a lapse of time.

In FIG. 5, after the wafer 2 is transferred into the processing chamber 1, placed on the wafer stage 3, and electrostatically adsorbed, the processing gas is introduced into the processing chamber 1 to start the processing. In the processing of the wafer 2, a step of performing the etching processing on the film layer to be processed disposed in advance on the upper surface of the wafer 2 by using the processing gas introduced into the processing chamber 1, exhausting the inside of the processing chamber 1, heating the wafer 2, and removing an adhered matter on the surface is defined as one cycle, and this cycle is performed at least once.

That is, in the etching processing apparatus 100, the side wall of the base chamber 11 is connected to a vacuum transfer container (not shown) which is another vacuum container, and the wafer 2 is transferred from a transfer chamber in the vacuum transfer container to the processing chamber 1 through a gate penetrating the vacuum transfer container and the base chamber 11. In the transfer chamber inside the vacuum transfer container, a transfer robot that holds the wafer 2 on a hand at a tip of an arm is disposed, the arm of the robot extends, the wafer 2 on the hand passes through the gate and moves from the transfer chamber to above the upper surface of the wafer stage 3 in the processing chamber 1, and then the wafer 2 is transferred onto the wafer stage 3.

When the DC power is supplied to the electrode plates 30 and the wafer 2 is electrostatically adsorbed and held on the dielectric film on the upper surface of the wafer stage 3, the He gas is introduced between the wafer 2 and the dielectric film, the heat transfer between the wafer 2 and the flow path 39 through which the coolant inside the wafer stage 3 flows is promoted, the wafer 2 is cooled, and the temperature decreases (S101).

After the step of cooling the wafer 2 in S101 is started, when a fact that the temperature of the wafer 2 decreases to a temperature within a predetermined range is detected by the control unit (not shown) that receives outputs from the thermocouple 70 and the thermocouple thermometer 71, the dilution gas which dilutes the gas that reacts with the film layer to be processed on the upper surface of the wafer 2 in the processing chamber 1 is supplied into the processing chamber 1 from the gas supply pipes 56 through the through holes of the shower plate 23 (S102).

Thereafter, the hydrogen fluoride gas and the alcohol (methyl alcohol in the present example) vapor are supplied as the processing gas into the processing chamber 1 through the gas supply pipes 56 and the through holes of the shower plate 23. Molecules of the supplied hydrogen fluoride and molecules of the supplied methyl alcohol react with each other to form an active species, the material formed by a reaction of the active species with the material constituting the film layer to be processed on the surface of the wafer 2 vaporizes, whereby the etching of the film layer proceeds (S103). The introduction of the processing gas is performed for a predetermined time.

Thereafter, the supply of the hydrogen fluoride (HF) gas and the alcohol gas into the processing chamber 1 is stopped. In the present embodiment, the supply of the processing gas is stopped by closing a valve disposed on each path of the raw material gas in the gas distributor 51 based on the command signal from the control unit. Alternatively, the supply of the alcohol is stopped by closing the valve 53 or 54 in the vapor feeder 47. Even during the etching step of S103, the exhaust of the processing chamber 1 through the exhaust port of vacuum pump of the exhaust unit 15 and the vacuum exhaust pipe 16 is performed, and when the introduction of the processing gas is stopped, particles such as the HF and the alcohol gas remaining in a gaseous phase inside the processing chamber 1, a product formed during the processing of the wafer 2, vaporized gas, and the like are exhausted.

In the etching of the invention, the deposit may be generated on the surface of the silicon nitride film, and the side wall and the surface of the film structure in which the film layer in which the silicon oxide films 103 and the silicon nitride films 102 are alternately sandwiched and stacked in the vertical direction has the groove or the hole, and the side wall inside the groove or the hole forms the end portion of the film layer. Therefore, in order to remove the adhered matter and the deposit, the silicon oxide films 103 are etched for a predetermined time, and then the wafer 2 is heated in vacuum to remove the deposit and the product (S105).

For the heating in the present example, the surface of the wafer 2 is irradiated with the IR light from the IR lamp 60 shown in FIG. 1 and heated by radiation. A method for heating the wafer 2 is not limited thereto, and for example, a method of heating the wafer 2 by heat conduction by heating the wafer stage 3 in a state where the wafer 2 is placed on and held on an upper surface of the dielectric film, or a method of heating the wafer 2 by transferring the wafer 2 from the processing chamber 1 to another device may be used. Further, when the IR light is emitted from the IR lamp 60, the Ar gas or the nitrogen gas may be introduced into the processing chamber 1 or another device.

After the wafer 2 is heated to remove the adhered matter and the deposit on the surface of the film structure, the wafer 2 is cooled again for a predetermined time to decrease the temperature (S106). Thereafter, it is determined whether the processing on the film layer to be processed of the wafer 2 is continued or stopped, and when it is determined by the control unit that the processing needs to be continued, the process returns to S102 and a cycle of next processing is started to continue the etching processing. When it is determined that it is not necessary to continue the processing, the processing is stopped in this cycle, and the processing of the film layer to be processed is ended.

That is, after the step of heating the wafer 2 in S105 or the step of cooling the wafer in S106 is ended, the etching amount 106 of the silicon oxide film 103 which is the film layer to be processed is detected, and the control unit which receives a detection result determines whether the detected etching amount reaches a predetermined value (S107). When it is determined that the detected etching amount does not reach the predetermined value, the control unit returns to the step of S102 and transmits the command signal to perform the cycle of the processing again. When it is determined that the detected etching amount reaches the predetermined value, the processing of the wafer 2 is stopped, and a command for desorbing the wafer 2 from the wafer stage 3 and transferring the wafer 2 to the outside of the processing chamber 1 is transmitted.

In the present example, it is determined whether the cycle of the processing is continued or stopped based on the result obtained by detecting the etching amount 106, but instead of detecting the etching amount 106, the control unit may be provided with a dedicated counter to count the number of cycles of the processing, and it may be determined in the control unit whether a predetermined number of times is reached as obtaining of a desired etching amount.

FIG. 5 schematically shows the outline of the operation performed by the etching processing apparatus 100 of the present example along the step of etching the wafer 2 shown in FIG. 4 with a lapse of time.

First, in a state of being held on the hand of the arm of the transfer robot, the wafer 2 is carried into the processing chamber 1 through a transfer port (not shown) of the gate disposed in the cylindrical side wall member of the base chamber 11 surrounding the processing chamber 1, and is transferred to the wafer stage 3. Thereafter, at a time point t1, the wafer 2 is held on the dielectric film constituting the upper surface of the wafer stage 3 by the DC power supplied from the DC power supplies 31 for the static adsorption to the electrode 30.

In this state, He gas 55 for promoting the heat transfer is supplied between the back surface of the wafer 2 and the upper surface of the dielectric film of the wafer stage 3, the heat transfer is performed between the wafer 2 and the wafer stage 3 in which a flow path 27 through which the coolant flows is disposed, and a step of cooling the wafer 2 corresponding to S101 shown in FIG. 4 is performed. The cooling step is continued until a time point t2.

Next, at the time point t2, as the step of S102 of FIG. 4, both or one of Ar gas 52 and Ar gas 53 is introduced into the gas distributor 51 on each supply path while a flow rate or a speed thereof is adjusted by the mass flow controller 50 disposed on each supply path, distributed to each of the plurality of gas supply pipes 56 in each gas distributor 51, and supplied to the through holes of the shower plate 23. Further, the gas is introduced downward from above the upper surface of the wafer 2 into the processing chamber 1 from the shower plate 23 through the through holes. Each of the Ar gas 52 and the Ar gas 53 is the dilution gas for diluting the HF gas or the dilution gas for diluting the alcohol gas introduced into the processing chamber 1 in a subsequent step.

In the present example, both or one of the Ar gas 52 and the Ar gas 53 which is the dilution gas introduced to the processing chamber 1 may be supplied until the etching processing of the silicon oxide film 103 is ended, or may be stopped during the etching processing. Alternatively, the nitrogen gas may be used as inert gas instead of the Ar gas. In the present example, the introduction of the dilution gas is continuously performed until the processing on the silicon oxide film 103 having the film structure on the wafer 2 is ended.

Next, at a time point t3, as the step of S103 of FIG. 4, the HF gas and the alcohol gas are supplied as the reactive gas into the processing chamber 1 at a predetermined flow rate or a predetermined speed for a predetermined time. In this state, atoms or molecules of the HF and the alcohol react with each other to start processing of a material of an end surface of the silicon oxide film 103 on the upper surface of the wafer 2.

In the present example, the HF gas and the alcohol gas may be simultaneously supplied, or one of the HF gas and the alcohol gas may be supplied prior to the other. Alternatively, the HF gas and the alcohol gas may be alternately supplied into the processing chamber 1. Step S103 is started from the time point t3 and continued until a time point t4.

As can be seen from the reaction formulas shown above, when a ratio of HF (hydrogen fluoride) to alcohol is close to 2:1 in terms of the gas flow rate (or molar ratio), the etching rate of the silicon oxide film 103 increases.

Examples of the used alcohol include methanol ($CH_3OH$), ethanol ($C_2H_5OH$), isopropanol (($CH_3)_2CHOH$), and the like. In the present example, methanol is desirable because it is easy to obtain higher vapor pressure at a low temperature and the selection ratio becomes higher from experimental results. As a physical property, methanol has a property of not azeotropic with water, whereas ethanol has a property of azeotropic with water. Accordingly, in a case where a large amount of water is contained in the film to be processed, it is possible to more effectively remove the contained water by using ethanol.

In the invention, inert gas such as Ar or $N_2$ is used as the dilution gas of the reactive gas. As an amount of the dilution gas introduced together with the reactive gas in the processing chamber 1 increases, the rate of the processing on the film to be etched tends to decrease. Accordingly, the supply amount of the dilution gas supplied into the processing chamber 1 is adjusted by the mass flow controller 50 adjusting the flow rate or the speed of the dilution gas on the supply path, so that the etching rate of the film to be processed can be adjusted to a value within a desired range.

The pressure in the processing chamber 1 used in step S103 or step S105 of the present embodiment is a value preferably within a range of about 10 Pa to 2000 Pa, and particularly is a value preferably within a range of 100 Pa to 1000 Pa. The higher pressure in the processing chamber 1 during the processing in these steps is, the higher the etching rate of the silicon oxide film is. However, since the etching rate of the silicon nitride film 102 tends to increase as the pressure in the processing chamber 1 increases, and the selection ratio is not greatly improved, it is desirable to select appropriate pressure in accordance with a specification required for the processing or an accuracy of a shape of a processing result.

After the etching processing of the silicon oxide film 103 in step S103 is performed for a predetermined time, the supply of the reactive gas containing the HF gas and the alcohol gas is stopped at the time point t4, and the exhaust of the processing chamber 1 in step S104 of FIG. 4 is started from the time point t4. In this step, while the supply amount of the gas to the processing chamber 1 is reduced, the exhaust by the exhaust unit 15 through the vacuum exhaust pipe 16 in the processing chamber 1 is continued, and the HF gas and the alcohol gas remaining in the gaseous phase of the processing chamber 1 are exhausted.

After the exhaust is continued from the time point t4, the supply of the He gas 55 for cooling the wafer 2 is stopped at a time point t5. During steps S102 to S105 from the time point t2 to the time point t5, the temperature of the wafer 2 is maintained at a value within a predetermined allowable range.

In the etching processing of the present embodiment, the deposit may be generated on a side wall of the film structure in which the side wall inside the groove or the hole formed in the film layer in which the silicon oxide films 103 and the silicon nitride films are alternately stacked in the vertical direction forms the end portion of the stacked film layer, and on the upper surface of the silicon nitride film 102 disposed on the uppermost surface of the film layer. As a result of analysis by the inventors using a total reflection red outer absorption spectrum, it is found that such a deposit is ammonium silicide.

Although ammonia is not used in the etching processing of step S103, it is assumed that ammonia is generated from nitrogen of the silicon nitride film 102 and ammonium silicide $(NH_4)_2SiF_6$ is generated by etching a part of the surface of the silicon nitride film 102. It is known that ammonium silicide which is the deposit is decomposed at 145° C. in a safety data sheet or the like.

Therefore, in the present embodiment, after the etching processing of step S103 is ended, as a step of S105 of FIG. 4, a step of heating the wafer 2 inside the processing chamber 1 depressurized to a predetermined vacuum degree to remove the generated and deposited ammonium silicide is performed. At the time point t5, the electric power is supplied to the IR lamp 60 in response to the command signal from the control unit, and the emission of the IR light is started. In the heating of the wafer 2 of the present example, the emission of the IR light of the IR (infrared) lamp 60 is used to raise the temperature of the wafer 2 to 145° C. or higher, but the heating method is not limited thereto. For example, the wafer 2 may be heated by a method of heating the wafer stage 3, or transferred to another device which is disposed outside the processing chamber 1 and performs only the heating to perform the heating processing.

When the IR light is emitted from the IR lamp 60 to the wafer 2 in the present step S105, the dilution gas such as the Ar gas and the nitrogen gas may be introduced into the processing chamber 1. Further, the heating of the wafer 2 may be performed a plurality of times as necessary, and the process may proceed to a next step without performing the heating when there is no generation of the deposit or there is little generation of the deposit. The heating of the wafer 2 by the emission of the IR light of the IR lamp 60 of the present embodiment is performed until a time point t6.

After the supply of the electric power to the IR lamp 60 is stopped and the emission of the IR light is stopped according to the command signal from the control unit at the time point t6, as the step of S106 of FIG. 4, the supply of the He gas 55 to a gap between the back surface of the wafer 2 and the upper surface of the dielectric film of the wafer stage 3 is started, and the heat transfer between the wafer 2 and the wafer stage 3 is promoted for a predetermined time to cool the wafer 2. At a subsequent time point t7, when it is detected from the outputs from the thermocouple 70 and the thermocouple thermometer 71 that the temperature of the wafer 2 is decreased to a value within a predetermined range, it is determined whether the etching amount 106 shown in S107 of FIG. 4 reaches a target value, and when it is determined that the etching amount 106 reaches the target value, the processing of the silicon oxide film 103 is ended.

When it is determined that the etching amount 106 does not reach the target value, the process returns to S103, and the steps shown in S103 to S106 are repeatedly performed. In this case, the steps shown at the time points t2 to t7 in the time chart of FIG. 5 are regarded as one cycle, and the cycle is repeated a plurality of times until it is determined that the target has been reached. By repeating such cycle a plurality of times, when there are a lot of deposits during the etching described above, an amount of remaining deposits after the processing of the wafer 2 is reduced by repeating the etching step of S103 in a short time and the removal of deposits by heating the wafer 2 in vacuum of S105, and the accuracy of the processed shape as a result of the processing is improved.

Second Embodiment

Next, another embodiment of the invention will be described with reference to FIG. 9. FIG. 9 is a vertical cross-sectional view schematically showing an outline of an overall configuration of an etching processing apparatus according to another embodiment of the invention.

An etching processing apparatus 200 of the present example has the same configuration as the etching processing apparatus 100 of the embodiment shown in FIG. 1 in that it includes the lower unit 57 including the base chamber 11. On the other hand, the second embodiment is different from the first embodiment in that the etching processing apparatus 200 includes an upper unit 58' including a discharge unit including a container having a cylindrical discharging region 13 in which plasma is formed inside is provided below the plurality of gas supply pipes 56 and above the IR lamp unit 59 and the shower plate 23 inside the upper unit cover 61 instead of the upper unit 58 of the embodiment in FIG. 1. In the following description, the parts described in the embodiment shown in FIG. 1 will be omitted unless otherwise specified.

In the present figure, in the etching processing apparatus 200, the upper unit 58' including a plasma source in which plasma is formed inside the discharging region 13 is disposed on the processing chamber 1 disposed inside the base chamber 11 of the lower unit 57. An ICP discharge method is used to form the plasma in the discharging region 13 of the present example. The plasma source caused by the ICP discharge can be used for cleaning an inner wall of a quartz chamber 12 surrounding the discharging region 13 caused by the plasma and for generating reactive gas caused by the plasma.

The quartz chamber 12 having a cylindrical outer circumference and a cylindrical inner circumference constituting the ICP plasma source is disposed such that a lower end portion thereof is placed on the ring-shaped IR lamp unit 59 disposed around a slit plate 26 having a circular plate shape above the wafer stage 3. On an outside of the quartz chamber 12 inside the metal upper unit cover 62 having a cylindrical shape, ICP coils 20 are disposed in a plurality of stages with gaps around outer peripheral side walls of the quartz chamber 12.

A radio frequency power supply 21 that supplies radio frequency power for forming an induction magnetic field that generates the plasma in the discharging region 13 is connected to the ICP coil 20 via a matching machine 22. A frequency band of several tens of MHz such as 13.56 MHz is used as a frequency of the radio frequency power. One of terminals of the radio frequency power supply 21 is electrically connected to a ground point.

A lower surface of an outer periphery edge portion of a top plate 25 having a circular plate shape is placed on an upper end of the cylindrical side wall of the quartz chamber 12 with a seal member such as an O-ring sandwiched therebetween, and the discharging region inside the quartz chamber 12 and an atmosphere of an outside atmospheric pressure are airtightly sealed. A gas dispersion plate 24 having a circular plate shape and the shower plate 23 below the gas dispersion plate 24 are disposed above the discharging region 13 below the top plate 25 so as to cover the discharging region 13. On the other hand, below the discharging region 13, the slit plate 26 is disposed in a central portion thereof, the cylindrical flow path 27 which communicates the discharging region 13 with the processing chamber 1 is disposed, the ring-shaped IR lamp unit 59 surrounding the flow path 27 is disposed on an outer peripheral side of the flow path 27, and a central portion of a bottom surface of the discharging region 13 is configured by an opening at an upper end of the flow path 27.

The top plate 25 is connected to the plurality of gas supply pipes 56 disposed above the top plate 25, and the gas supply pipes 56 communicate with through holes vertically penetrating the gas dispersion plate 24. Similar to the etching processing apparatus 100 of the embodiment shown in FIG. 1, dilution gas or processing gas distributed by the plurality of gas distributors 51 and supplied through the gas supply pipes 56 passes through a plurality of through holes of the gas dispersion plate 24 in a dispersed manner, passes through the plurality of through holes of the shower plate 23 below, and is introduced into the discharging region 13 inside the quartz chamber 12 from above.

Particles of the gas introduced into the discharging region 13 are excited by an induction current generated by the induction magnetic field from the ICP coils 20 to cause ionization and dissociation, thereby generating the plasma in the discharging region 13. When the particles in the plasma move downward and flow into the processing chamber 1 through the plurality of through holes disposed in the slit plate 26, movement of charged particles in the plasma to the processing chamber 1 is prevented, and many electrically neutral activated particles (radicals) are introduced into the processing chamber 1.

Also in the present example, the vacuum exhaust unit 63 is disposed below the base chamber 11 to exhaust and depressurize the inside of the processing chamber 1, and the exhaust unit 15 is disposed to communicate with and connect to the processing chamber 1 via the vacuum exhaust pipe 16. When the inside of the processing chamber 1 is exhausted and depressurized by driving of the exhaust unit 15, an inside of the discharging region 13 communicating with the processing chamber 1 via the through holes of the slit plate 26 disposed inside the flow path 27 is exhausted and depressurized.

[Etching Process]

Also in the present example, etching processing is performed on the silicon oxide film 103 in a film structure in which the silicon oxide films 103 and the silicon nitride films 102 disposed on an upper surface of the wafer 2 are alternately stacked in a vertical direction under the same processing conditions as in the first embodiment. Since the etching processing apparatus 200 is equipped with an ICP discharge type plasma generation mechanism, a step of forming the plasma using oxygen and cleaning a surface inside the quartz chamber 12 with particles of the oxygen plasma is performed for 300 seconds before an etching process. With this step, it is possible to reduce the number of parties which are released from the surface inside the quartz chamber 12 into the discharging region 13, move into the processing chamber 1, and cause a bad influence on the surface of the wafer 2 and processing thereof.

As a preferable example of the etching process, the silicon oxide films 103 and the silicon nitride films 102 formed on the upper surface of the wafer 2 by plasma CVD in advance are etched by using hydrogen fluoride (HF) gas and methanol gas at a temperature of −30° C. of the wafer 2. As a composition and a flow rate of the gas used in the etching, values of 100 sccm, 200 sccm, 300 sccm, 400 sccm, 500 sccm, 600 sccm, and 800 sccm of methanol are used for 400 sccm of hydrogen fluoride. Further, Ar gas which is the dilution gas for methanol is introduced into the processing chamber 1 at 100 sccm, and the introduction of the methanol gas is started one second after the introduction of the hydrogen fluoride gas into the processing chamber 1 is started.

Pressure in the processing chamber 1 during the etching is maintained at a value within an allowable range including 300 Pa, and the etching processing is performed for 120 seconds. Further, after steps of the etching processing on the silicon oxide films 103 are ended, the inside of the processing chamber 1 is exhausted for 30 seconds, and the particles of the processing gas and a reaction product remaining and floating inside the processing chamber 1 are discharged. Thereafter, the wafer 2 is heated twice by irradiating, for 50 seconds, the surface of the wafer 2 with IR light emitted by supplying DC power is supplied to the IR lamp 60. In the present example, a maximum temperature of the wafer 2 in the step of heating the wafer 2 is about 250° C. After the emission from the IR lamp 60 is stopped and the step of heating is ended, a step of cooling of lowering the temperature of the wafer 2 is performed for 120 seconds, and then the processing on the wafer 2 in the processing chamber 1 is ended. Thereafter, the wafer 2 is transferred to a hand portion at a tip of an arm of a transfer robot that enters the processing chamber 1 and carried out of the processing chamber 1.

The inventors detect a remaining film thickness and calculate an etching rate after the etching processing on the stacked film on the surface of the wafer 2 inside the etching processing apparatus 200 is ended. A relationship between the etching rate and an amount of methanol with respect to hydrogen fluoride used as the processing gas will be described with reference to FIG. 10. FIG. 10 is a graph showing the relationship between the etching rate of a film to be processed and the amount of methanol with respect to hydrogen fluoride used as the processing gas in the etching processing performed by the etching processing apparatus according to the embodiment shown in FIG. 9.

As shown in FIG. 10, it is found that the etching rate of the silicon oxide film is high when the amount of methanol gas with respect to that of hydrogen fluoride gas is small, and the etching rate of the silicon nitride film is not much affected by a ratio of the methanol gas. It is found that in particular, a selection ratio of the etching of the silicon oxide film with respect to the silicon nitride film is 15 or more when the amount of the methanol gas with respect to the hydrogen fluoride gas is 25% to 50%.

When the stacked film of the silicon oxide films and the silicon nitride films is etched by the process described above at −30° C. under a condition that the amount of the methanol gas with respect to the hydrogen fluoride gas is 25% to 50%, it is found that, as in the example of the etching result shown in FIG. 2B, a film layer of the film structure, at least an end surface of the silicon oxide film 103 of the film to be processed can be selectively etched in a shape having a cross section close to a rectangle.

REFERENCE SIGN LIST

1 processing chamber
2 wafer
3 wafer stage
11 base chamber
12 quartz chamber
13 discharging region
14 pressure adjusting unit
15 exhaust unit
16 vacuum exhaust pipe
20 ICP coil
21 radio frequency power supply
22 matching machine
23 shower plate
24 gas dispersion plate
25 top plate
26 slit plate
27 flow path
30 electrode
31 DC power supply
38 chiller
39 flow path for coolant
45 liquid tank
46 heater
47 vapor feeder
50, 50-2 mass flow controller
51 gas distributor
52 Ar gas
53, 54 valve
55 He gas
56 gas supply pipe
57 lower unit
58, 58' upper unit
59 IR lamp unit
60-1, 60-2, 60-3 IR lamp
61 reflection plate
62 upper unit cover
63 vacuum exhaust unit
64 IR lamp power supply
70 thermocouple
71 thermocouple thermometer
72 IR light transmission window
73 IR lamp power supply
74 radio frequency cut filter
101 substrate
102 silicon nitride film
103 silicon oxide film
104 opening
105 stacked film

The invention claimed is:

1. An etching method of etching a film structure, in which an end portion of a film layer in which a silicon oxide film and a silicon nitride film formed in advance on a wafer disposed in a processing chamber are alternately stacked in a vertical direction forms a side wall of a groove or a hole, by supplying processing gas into the processing chamber, the etching method comprising:

a step of supplying hydrogen fluoride and alcohol vapor into the processing chamber, maintaining the wafer at a temperature in a range of −30° C. and −50° C. and the pressure of the processing chamber in a range of 100 Pa and 1000 Pa, and etching the silicon oxide film from the end portion in a lateral direction; and a step of removing deposits of ammonium hexafluorosilicate derived from materials of the silicon nitride film, after the step of etching the silicon oxide film.

2. The etching method according to claim 1, further comprising:

the step of removing deposits after a step of etching the silicon oxide film by supplying the vapor is performed by heating the wafer.

3. The etching method according to claim 2, wherein in the step of heating the wafer, the wafer is heated by emitting light from a lamp.

4. The etching method according to claim 2, wherein a plurality of steps including the step of etching the silicon oxide film by supplying the hydrogen fluoride and the alcohol vapor and the step of removing deposits are regarded as one cycle, and the cycle is repeated a plurality of times to etch the silicon oxide film.

5. The etching method according to claim 2, wherein the alcohol is methanol.

6. The etching method according to claim 2, wherein inert gas is supplied into the processing chamber together with the hydrogen fluoride and the alcohol vapor.

7. The etching method according to claim 1, wherein a plurality of steps including the step of etching the silicon oxide film by supplying the hydrogen fluoride and the alcohol vapor and the step of removing deposits are regarded as one cycle, and the cycle is repeated a plurality of times to etch the silicon oxide film.

8. The etching method according to claim 1, wherein the alcohol is methanol.

9. The etching method according to claim 1, wherein inert gas is supplied into the processing chamber together with the hydrogen fluoride and the alcohol vapor.

* * * * *